US008835231B2

(12) United States Patent
Bangsaruntip et al.

(10) Patent No.: US 8,835,231 B2
(45) Date of Patent: Sep. 16, 2014

(54) METHODS OF FORMING CONTACTS FOR NANOWIRE FIELD EFFECT TRANSISTORS

(75) Inventors: Sarunya Bangsaruntip, Mount Kisco, NY (US); Guy M. Cohen, Mohegan Lake, NY (US); Shreesh Narasimha, Beacon, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 12/856,718

(22) Filed: Aug. 16, 2010

(65) Prior Publication Data

US 2012/0037880 A1    Feb. 16, 2012

(51) Int. Cl.
| | |
|---|---|
| *H01L 21/00* | (2006.01) |
| *H01L 21/84* | (2006.01) |
| *H01L 29/775* | (2006.01) |
| *H01L 29/06* | (2006.01) |
| *H01L 29/423* | (2006.01) |
| *B82Y 10/00* | (2011.01) |
| *B82Y 40/00* | (2011.01) |
| *H01L 29/786* | (2006.01) |
| *H01L 29/66* | (2006.01) |
| *H01L 21/8234* | (2006.01) |
| *H01L 27/12* | (2006.01) |

(52) U.S. Cl.
CPC .......... *H01L 29/0673* (2013.01); *H01L 29/775* (2013.01); *H01L 21/823412* (2013.01); *H01L 27/1203* (2013.01); *H01L 29/42392* (2013.01); *B82Y 10/00* (2013.01); *B82Y 40/00* (2013.01); *H01L 29/78696* (2013.01); *H01L 29/66439* (2013.01); *Y10S 977/938* (2013.01)
USPC .................... 438/151; 257/E21.409; 977/938

(58) Field of Classification Search
CPC ........................ H01L 29/0673; Y10S 977/938
USPC .................... 438/151; 257/E21.409; 977/938
See application file for complete search history.

(56) References Cited

U.S. PATENT DOCUMENTS

| | | | |
|---|---|---|---|
| 4,995,001 | A | 2/1991 | Dawson et al. |
| 5,308,445 | A | 5/1994 | Takasu |

(Continued)

FOREIGN PATENT DOCUMENTS

| | | |
|---|---|---|
| EP | 217811 A1 | 4/2010 |
| KR | 20090044799 A | 5/2009 |

(Continued)

OTHER PUBLICATIONS

International Search Report; International Application No. PCT/US11/49501; International Filing Date: Aug. 29, 2011; Date of Mailing: Jan. 18, 2012.

(Continued)

*Primary Examiner* — Howard Weiss
(74) *Attorney, Agent, or Firm* — Cantor Colburn LLP; Vazken Alexanian

(57) ABSTRACT

A method for forming a nanowire field effect transistor (FET) device includes forming a nanowire over a semiconductor substrate, forming a gate stack around a portion of the nanowire, forming a capping layer on the gate stack, forming a spacer adjacent to sidewalls of the gate stack and around portions of nanowire extending from the gate stack, forming a hardmask layer on the capping layer and the first spacer, forming a metallic layer over the exposed portions of the device, depositing a conductive material over the metallic layer, removing the hardmask layer from the gate stack, and removing portions of the conductive material to define a source region contact and a drain region contact.

20 Claims, 5 Drawing Sheets

(56) References Cited

U.S. PATENT DOCUMENTS

| | | | |
|---|---|---|---|
| 5,438,018 A | 8/1995 | Mori et al. | |
| 5,552,622 A | 9/1996 | Kimura | |
| 5,574,308 A | 11/1996 | Mori et al. | |
| 5,668,046 A | 9/1997 | Koh et al. | |
| 6,365,465 B1 | 4/2002 | Chan et al. | |
| 6,642,115 B1 | 11/2003 | Cohen et al. | |
| 6,653,209 B1 | 11/2003 | Yamagata | |
| 6,806,141 B2 | 10/2004 | Kamins | |
| 6,835,618 B1 | 12/2004 | Dakshina-Murthy et al. | |
| 6,855,606 B2 | 2/2005 | Chen et al. | |
| 6,882,051 B2 | 4/2005 | Majumdar et al. | |
| 6,891,227 B2 | 5/2005 | Appenzeller et al. | |
| 6,903,013 B2 | 6/2005 | Chan et al. | |
| 6,996,147 B2 | 2/2006 | Majumdar et al. | |
| 7,101,762 B2 | 9/2006 | Cohen et al. | |
| 7,151,209 B2 | 12/2006 | Empedocles et al. | |
| 7,180,107 B2 | 2/2007 | Appenzeller et al. | |
| 7,211,853 B2 | 5/2007 | Bachtold et al. | |
| 7,253,060 B2 | 8/2007 | Yun et al. | |
| 7,297,615 B2 | 11/2007 | Cho et al. | |
| 7,311,776 B2 | 12/2007 | Lin et al. | |
| 7,443,025 B2 | 10/2008 | Verbist | |
| 7,446,025 B2 | 11/2008 | Cohen et al. | |
| 7,449,373 B2 | 11/2008 | Doyle et al. | |
| 7,452,759 B2 | 11/2008 | Sandhu | |
| 7,452,778 B2 | 11/2008 | Chen et al. | |
| 7,456,068 B2 | 11/2008 | Kavalieros et al. | |
| 7,456,476 B2 | 11/2008 | Hareland et al. | |
| 7,473,943 B2 | 1/2009 | Mostarshed et al. | |
| 7,498,211 B2 | 3/2009 | Ban et al. | |
| 7,534,675 B2 | 5/2009 | Bangsaruntip et al. | |
| 7,550,333 B2 | 6/2009 | Shah et al. | |
| 7,569,941 B2 | 8/2009 | Majumdar et al. | |
| 7,642,578 B2 | 1/2010 | Lee et al. | |
| 7,791,144 B2 | 9/2010 | Chidambarrao et al. | |
| 7,795,677 B2 | 9/2010 | Bangsaruntip et al. | |
| 7,799,657 B2 | 9/2010 | Dao | |
| 7,803,675 B2 | 9/2010 | Suk et al. | |
| 7,834,345 B2 | 11/2010 | Bhuwalka et al. | |
| 7,871,870 B2 | 1/2011 | Mostarshed et al. | |
| 7,893,506 B2 | 2/2011 | Chau et al. | |
| 8,064,249 B2 | 11/2011 | Jang et al. | |
| 8,097,515 B2 | 1/2012 | Bangsaruntip et al. | |
| 8,154,127 B1 | 4/2012 | Kamins et al. | |
| 8,338,280 B2 | 12/2012 | Tan et al. | |
| 8,541,774 B2 | 9/2013 | Bangsaruntip et al. | |
| 2004/0149978 A1 | 8/2004 | Snider | |
| 2004/0166642 A1 | 8/2004 | Chen et al. | |
| 2005/0121706 A1 | 6/2005 | Chen et al. | |
| 2005/0266645 A1 | 12/2005 | Park | |
| 2005/0275010 A1 | 12/2005 | Chen et al. | |
| 2006/0033145 A1 | 2/2006 | Kakoschke et al. | |
| 2006/0131665 A1 | 6/2006 | Murthy et al. | |
| 2006/0138552 A1 | 6/2006 | Brask et al. | |
| 2006/0197164 A1 | 9/2006 | Lindert et al. | |
| 2007/0001219 A1 | 1/2007 | Radosavljevic et al. | |
| 2007/0267619 A1 | 11/2007 | Nirschl | |
| 2007/0267703 A1 | 11/2007 | Chong et al. | |
| 2007/0284613 A1 | 12/2007 | Chui et al. | |
| 2008/0014689 A1 | 1/2008 | Cleavelin et al. | |
| 2008/0061284 A1 | 3/2008 | Chu et al. | |
| 2008/0067495 A1 | 3/2008 | Verhulst | |
| 2008/0067607 A1 | 3/2008 | Verhulst et al. | |
| 2008/0079041 A1 | 4/2008 | Suk et al. | |
| 2008/0085587 A1 | 4/2008 | Wells et al. | |
| 2008/0121932 A1 | 5/2008 | Ranade | |
| 2008/0128760 A1* | 6/2008 | Jun et al. | 257/280 |
| 2008/0135949 A1 | 6/2008 | Lo et al. | |
| 2008/0142853 A1 | 6/2008 | Orlowski | |
| 2008/0149914 A1 | 6/2008 | Samuelson et al. | |
| 2008/0149997 A1 | 6/2008 | Jin et al. | |
| 2008/0150025 A1 | 6/2008 | Jain | |
| 2008/0179752 A1 | 7/2008 | Yamauchi et al. | |
| 2008/0191196 A1 | 8/2008 | Lu et al. | |
| 2008/0224224 A1 | 9/2008 | Vandenberghe et al. | |
| 2008/0227259 A1 | 9/2008 | Avouris et al. | |
| 2008/0246021 A1 | 10/2008 | Suk et al. | |
| 2008/0247226 A1 | 10/2008 | Liu et al. | |
| 2008/0290418 A1 | 11/2008 | Kalburge | |
| 2009/0026553 A1 | 1/2009 | Bhuwalka et al. | |
| 2009/0057650 A1 | 3/2009 | Lieber et al. | |
| 2009/0057762 A1 | 3/2009 | Bangsaruntip et al. | |
| 2009/0061568 A1 | 3/2009 | Bangsaruntip et al. | |
| 2009/0090934 A1 | 4/2009 | Tezuka et al. | |
| 2009/0134467 A1 | 5/2009 | Ishida et al. | |
| 2009/0149012 A1 | 6/2009 | Brask et al. | |
| 2009/0181477 A1 | 7/2009 | King et al. | |
| 2009/0217216 A1 | 8/2009 | Lee et al. | |
| 2009/0294864 A1 | 12/2009 | Suk et al. | |
| 2010/0140589 A1 | 6/2010 | Ionescu | |
| 2010/0193770 A1 | 8/2010 | Bangsaruntip et al. | |
| 2010/0207102 A1 | 8/2010 | Lee et al. | |
| 2011/0012176 A1 | 1/2011 | Chidambarrao et al. | |
| 2011/0133167 A1 | 6/2011 | Bangsaruntip et al. | |
| 2011/0133169 A1 | 6/2011 | Bangsaruntip et al. | |
| 2011/0147840 A1* | 6/2011 | Cea et al. | 257/347 |
| 2012/0146000 A1 | 6/2012 | Bangsaruntip et al. | |
| 2013/0001517 A1 | 1/2013 | Bangsaruntip et al. | |

FOREIGN PATENT DOCUMENTS

| | | |
|---|---|---|
| WO | 02084757 A1 | 10/2002 |
| WO | WO2008069765 A1 | 6/2008 |

OTHER PUBLICATIONS

International Search Report Written Opinion; International Application No. PCT/US11/49501; International Filing Date: Aug. 29, 2011; Date of Mailing: Jan. 18, 2012.

G.W. Neudeck, "An Overview of Double-Gate MOSFETs," Proceedings of 15th Biennial University/Government/Industry Microelectronics Symposium. UGIM 2003. New York, NY: IEEE, US, Jun. 30-Jul. 2, 2003., pp. 214-217.

International Search Report; International Application No. PCT/EP2010/066961; International Filing Date: Nov. 8, 2010; Date of Mailing: Feb. 10, 2011.

International Search Report; International Application No. PCT/EP2010/066483; International Filing Date: Oct. 29, 2010; Date of Mailing: Feb. 7, 2011.

International Search Report—Written Opinion; International Application No. PCT/EP2010/066483; International Filing Date: Oct. 29, 2010; Date of Mailing: Feb. 7, 2011.

International Search Report—Written Opinion; International Application No. PCT/EP2010/066961; International Filing Date: Nov. 8, 2010; Date of Mailing: Feb. 10, 2011.

Pavanello et al., "Evaluation of Triple-Gate FinFETs With SiO2-HfO2-TiN Gate Stack Under Analog Operation," Solid State Electronics, Elsevier Science Publishers, Barking, GB, vol. 51, No. 2, Mar. 7, 2007, pp. 285-291.

International Search Report; International Application No. PCT/US2011/029304; International Filing Date: Mar. 22, 2011; Date of Mailing: May 20, 2011.

International Search Report—Written Opinion; International Application No. PCT/US2011/029304; International Filing Date: Mar. 22, 2011; Date of Mailing: May 20, 2011.

International Search Report; International Application No. PCT/EP2011/053174; International Filing Date: Mar. 3, 2011; Date of Mailing: May 31, 2011.

International Search Report—Written Opinion; International Application No. PCT/EP2011/053174; International Filing Date: Mar. 3, 2011; Date of Mailing: May 31, 2011.

Alexander J. Gates, "Designing a Nanoelectronic Circuit to Control a Millimeter-scale Walking Robot," Mitre Technical Paper, Nov. 2004, http://www.mitre.org/work/tech_papers/tech_papers_04/04_1248/04_1248.pdf.

Andriotis et al., "Realistic nanotube-metal contact configuration for molecular electronics applications," IEEE Sensors Journal, vol. 8, No. 6, Jun. 2008.

(56) References Cited

OTHER PUBLICATIONS

R. Bahar, "Trends and Future Directions in Nano Structure Based Computing and Fabrication," ICCD 2006, International Conf. on Computer Design, Oct. 1-4, 2007, pp. 522-527.
Buddharaju et al., "Gate-All-Around Si-Nanowire CMOS Inverter Logic Fabricated Using Top-Down Approach," European Solid-State Device Research Conference, Sep. 11, 2007, pp. 303-306.
Chen et al., "Demonstration of Tunneling FETs Based on Highly Scalable Verticle Silicon Nanowires," IEEE Electron Device Letters, vol. 30, No. 7, Jul. 2009, pp. 754-756.
Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008. Jun. 2-4, 2008 pp. 265-268.
Hu et al., "Fringing field effects on electrical resistivity of semiconductor nanowire-metal contacts," Applied Physics Letters 92, 083503_2008.
Jie Xiang et al., "Ge/Si Nanowire Heterostructures as High-Performance Field-Effect Transistors," Nature 441, 489-493 (May 25, 2006).
Knoch et al., "Tunneling phenomena in carbon nanotube field-effect transistors," Phys Stat Sol. (a) 205, No. 4, 679-694 (2008).
Leonard et al., "Size-dependent effects on electrical contacts to nanotubes and nanowires," Phys Rev Lett., Jul. 14, 2006; 97(2):026804.
M. M. Ziegler et al., "The CMOS/NANO Interface from a Circuits Perspective," ISCAS '03. Proceedings of the 2003 International Symposium on Circuits and Systems, 2003, May 25-28, 2003, vol. 4, pp. IV-904-IV-907.
M. T. Bjork et al., "Silicon Nanowire Tunneling Field-Effect Transistors," Applied Physics Letters 92, 193504 (2008).
Ma et al., "High-performance nanowire complementary metal-semiconductor inverters," Applied Physics Letters 93, 053105_2008.
Saumitra Raj mehrotra, "A Simulation Study of Silicom Nanowire Field Effect Transistors (FETs)," University of Cincinnati, Jul. 2007.
Lauhon et al., "Epitaxial core-shell and core-multishell nanowire heterostructures," Nature, vol. 420, Nov. 7, 2002, pp. 57-61.
Singh et al., "Si, SiGe Nanowire Devices by Top-Down Technology and Their Applications," IEEE Transactions on Electron Devices, vol. 55, No. 11, Nov. 2008, pp. 3107-3118.
Taichi Su et al., "New Planar Self-Aligned Double-Gate Fully Depleted P-MOSFET's Using Epitaxial Lateral Overgrowth (ELO) and Selectively Grown Source/Drain (S/D)," 2000 IEEE International SOI Conference, Oct. 2000, pp. 110-111.
N. Checka, "Circuit Architecture for 3D Integration," Chapter 13 in Wafer Level 3-D ICs Process Technology, ed. C.S. Tan, Springer US, 2008, ISBN 978-0-387-76534-1.
Notice of Allowance for U.S. Appl. No. 12/776,485, filed May 10, 2010; First Named Inventor: Sarunya Bangsaruntip; Mailing Date: Sep. 26, 2012.
Office Action—Final for U.S. Appl. No. 13/372,719, filed Feb. 14, 2012; First Named Inventor: Sarunya Bangsaruntip; Mailing Date: Sep. 4, 2012.
Checka, N., 'Circuit Architecture for 3D Integration', Chapter 13 in Wafer Level 3-D ICs Process Technology, ed. C.S. Tan, Springer US, 2008, ISBN 978-0-387-76534-1.
Chen et al., "An Integrated Logic Circuit Assembled ona Single Carbon Nanotube", www.sciencemag.org Science, vol. 311, Mar. 24, 2006, p. 1735.
Derycke, et al, "Carbon Nanotube Inter- and Intramolecular Logic Gates" Nano Letters, Sep. 2001, vol. 1, No. 9, pp. 453-456.
Hu et al., 'Fringing field effects on electrical resistivity of semiconductor nanowire-metal contacts', Applied Physics Letters 92, 083503, Feb. 27, 2008.
Lauhon et al., 'Epitaxial core-shell and core-multishell nanowire heterostructures', Nature, vol. 420, Nov. 7, 2002, pp. 57-61.
Office Action—Final for U.S. Appl. No. 12/684,280, filed Jan. 8, 2010; First Namd Inventor: Sarunya Bangsaruntip; Mailing Date: Oct. 5, 2011.

Transmittal and International Preliminary Report on Patentability for International Application No. PCT/US2011/029304; International Filing Date: Mar. 22, 2011; date of mailing Oct. 26, 2012, 2 pages.
Written Opinion for International Application No. PCT/US2011/029304; International Filing Date: Mar. 22, 2011; mailing date: May 20, 2011; 5 pages.
Office Action—Non-Final for U.S. Appl. No. 13/556,300, filed Jul. 24, 2012; First Named Inventor: Sarunya Bangsaruntip; Mailing Date: Dec. 10, 2012.
Office Action—Non-Final for U.S. Appl. No. 13/551,995, filed Jul. 18, 2012; First named Inventor: Sarunya Bangsaruntip; Mailing Date: Dec. 19, 2012.
Office Action—Non-Final for U.S. Appl. No. 13/372,714, filed Feb. 14, 2012; First Named Inventor: Sarunya Bangsaruntip et al.; Mailing Date: Sep. 20, 2012.
Office Action—Notice of Allowance for U.S. Appl. No. 13/551,995, filed Jul. 18, 2012; First Named Inventtor: Sarunya Bangsaruntip; Mailing Date: Jul. 15, 2013; 13 pages.
Office Action—Final for U.S. Appl. No. 13/551,995, filed Jul. 18, 2012; First Named Inventor: Sarunya Bangsaruntip; Mailing Date Apr. 30, 2013; 11 pgs.
Office Action—Non-Final for U.S. Appl. No. 12/684,280, filed Jan. 8, 2010; First Named Inventor: Sarunya Bangsaruntip; Mailing Date: May 2, 2011.
Office Action—Non-Final for U.S. Appl. No. 12/778,315, filed May 12, 2010; First Named Inventor: Sarunya Bangsaruntip; Mailing Date: Mar. 26, 2012.
Office Action—Non-Final for U.S. Appl. No. 13/550,700, filed Jul. 17, 2012; First Named Inventor: Sarunya Bangsaruntip; Mailing Date: Apr. 25, 2013; 27 pgs.
Office Action—Non-Final for U.S. Appl. No. 12/856,718, filed Aug. 16, 2010; first Named Inventor Sarunya Bangsaruntip; Mailing Date: Jul. 9, 2012.
Office Action—Non-Final for U.S. Appl. No. 13/600,585, filed Aug. 31, 2012; First Named Inventor: Sarunya Bangsaruntip; Mailing Date: Dec. 13, 2012.
Office Action—Non-Final for U.S. Appl. No. 12/776,485, filed May 10, 2010; Fist Named Inventor: Sarunya Bangsaruntip; Mailing Date: Feb. 21, 2012.
Office Action—Non-Final for U.S. Appl. No. 13/372,719, filed Feb. 14, 2012; First named Inventor: Sarunya Bangsaruntip; Mailing Date: May 7, 2012.
Office Action—Non-Final for U.S. Appl. No. 12/631,199, filed Dec. 4, 2009; First Named Inventor: Sarunya Bangsaruntip; Mailing Date: Jun. 13, 2012.
Office Action—Non-Final for U.S. Appl. No. 13/372,719, filed Feb. 14, 2012; First Named Inventor: Sarunya Bangsaruntip; Mailing Date: Jul. 5, 2013, 28 pgs.
Office Action—Non-Final for U.S. Appl. No. 13/372,714, filed Feb. 14, 2012; Fist Named Inventor: Sarunya Bangsaruntip et al.; Mailing Date: Sep. 20, 2012.
Office Action—Non-Final for U.S. Appl. No. 13/372,719, filed Feb. 14, 2012; First Named Inventor: Sarunya Bangsaruntip; Mailing Date: Sep. 4, 2012.
Office Action—Non-Final for U.S. Appl. No. 12/884,707, filed Sep. 17, 2010; Fist Named Inventor: Sarunya Bangsaruntip et al.; Mailing Date: Oct. 2, 2012.
Office Action—Restriction Election for U.S. Appl. No. 12/684,280, filed Jan. 8, 2010; First Named Inventor: Sarunya Bangsaruntip; Mailing Date: Feb. 10, 2011.
Office Action—Restriction Election for U.S. Appl. No. 12/776,485, filed May 10, 2010; First Named Inventor : Sarunya Bangsaruntip; Mailing Date: Dec. 9, 2011.
Office Action—Final for U.S. Appl. No. 12/684,280, filed Jan. 8, 2010; First Named Inventor: Sarunya Bangsaruntip; Mailing Date: Oct. 5, 2011.
Restriction/Election Office Action for U.S. Appl. No. 12/758,939, filed Apr. 13, 2010; First Named Inventor: Sarunya Bangsaruntip; Mailing Date: Jun. 8, 2012.

* cited by examiner

METHODS OF FORMING CONTACTS FOR NANOWIRE FIELD EFFECT TRANSISTORS

FIELD OF INVENTION

The present invention relates to semiconductor nanowire field effect transistors.

DESCRIPTION OF RELATED ART

A nanowire field effect transistor (FET) includes doped portions of nanowire that contact the channel region and serve as source and drain regions of the device. Previous fabrication methods that used ion-implantation to dope the small diameter nanowire may result in undesirable amorphization of the nanowire or an undesirable junction doping profile.

BRIEF SUMMARY

In one aspect of the present invention, a method for forming a nanowire field effect transistor (FET) device includes forming a nanowire over a semiconductor substrate, forming a gate stack around a portion of the nanowire, forming a capping layer on the gate stack, forming a spacer adjacent to sidewalls of the gate stack and around portions of nanowire extending from the gate stack, forming a hardmask layer on the capping layer and the first spacer, forming a metallic layer over the exposed portions of the device, depositing a conductive material over the metallic layer, removing the hardmask layer from the gate stack, and removing portions of the conductive material to define a source region contact and a drain region contact.

In another aspect of the present invention, a nanowire field effect transistor (FET) device includes a channel region including a silicon nanowire portion having a first distal end extending from the channel region and a second distal end extending from the channel region, the silicon portion is partially surrounded by a gate stack disposed circumferentially around the silicon portion, a source region including the first distal end of the silicon nanowire portion, a drain region including the second distal end of the silicon nanowire portion, a metallic layer disposed on the source region and the drain region, a first conductive member contacting the metallic layer of the source region, and a second conductive member contacting the metallic layer of the drain region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-4 are cross-sectional views illustrating exemplary methods for forming contacts for field effect transistor (FET) devices, in which:

FIG. 1 illustrates the formation of gate stacks about nanowires;

FIG. 2 illustrates the formation of a first metallic layer;

FIG. 3 illustrates the formation of a contact material; and

FIG. 4 illustrates the removal of a portion of the contact material.

DETAILED DESCRIPTION

Figure 1:
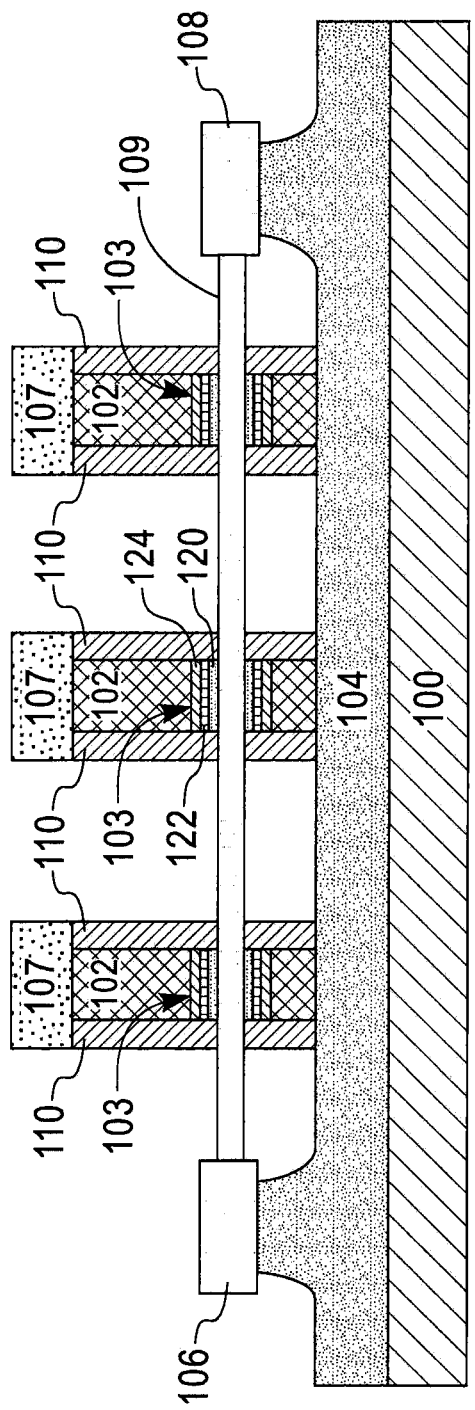

FIG. 1 illustrates a cross-sectional view of a plurality of FET devices. A silicon on insulator (SOI) pad region 106, pad region 108, and nanowire portion 109 are defined on a buried oxide (BOX) layer 104 that is disposed on a silicon substrate 100. The pad region 106, pad region 108, and nanowire portion 109 may be patterned by the use of lithography followed by an etching process such as, for example, reactive ion etching (RIE). Once the pad region 106, pad region 108, and nanowire portion 109 are patterned, an isotropic etching process suspends the nanowires 109 above the BOX layer 104. Following the isotropic etching, the nanowire portions 109 may be smoothed to form elliptical shaped (and in some cases, cylindrical shaped) nanowires 109 that are suspended above the BOX layer 104 by the pad region 106 and the pad region 108. An oxidation process may be performed to reduce the diameter of the nanowires 109 to desired dimensions.

Once the nanowires 109 are formed, a gate stack 103 including layers 120, 122 and 124 is formed around the nanowires 109, as described in further detail below, and may be capped with a polysilicon layer 102. A hardmask layer 107, such as, for example silicon nitride ($Si_3N_4$) is deposited over the polysilicon layer 102. The polysilicon layer 102 and the hardmask layer 107 may be formed by depositing polysilicon material over the BOX layer 104 and the SOI portions (all which are covered by the gate stack 103), depositing the hardmask material over the polysilicon material, and etching by reactive ion etching (RIE) to form the polysilicon layer (capping layer) 102 and the hardmask layer 107 illustrated in FIG. 1. The etching of the hardmask 107, the polysilicon layer 102, and the gate stack 103 may be performed by directional etching that results in straight sidewalls of the gates 103. Following the directional etching, polysilicon 102 remains under the nanowires 109 including regions that may not be masked by the hardmask 107. Isotropic etching may be performed to remove polysilicon 102 from under the nanowires 109.

In an alternate embodiment, a metal gate may be formed in a similar manner as described above, however, the polysilicon layer 102 and gates 103 are replaced by metal gate materials resulting in a similar structure. The material substituting the polysilicon 102 is conductive and serves as a barrier for oxygen diffusion to minimize regrowth of the interfacial layer between the nanowire and the gate dielectric. The material is sufficiently stable to withstand various processes that may include elevated temperatures.

The fabrication of the arrangement shown in FIG. 1 may be performed using similar methods as described above for the fabrication of a single row of gates. The methods described herein may be used to form any number of devices on a nanowire between pad regions 106 and 108.

The gate stack 103 is formed by depositing a first gate dielectric layer 120, such as silicon dioxide ($SiO_2$) around the nanowire 109. A second gate dielectric layer 122 such as, for example, hafnium oxide ($HfO_2$) is formed around the first gate dielectric layer 120. A metal layer 124 such as, for example, tantalum nitride (TaN) is formed around the second gate dielectric layer 122. The metal layer 124 is surrounded by polysilicon layer 102. Doping the polysilicon layer 102 with impurities such as boron (p-type), or phosphorus (n-type) makes the polysilicon layer 102 conductive.

A first set of spacers 110 are formed along opposing sides of the etched polysilicon layer 102. The spacers 110 are formed by depositing a blanket dielectric film such as silicon nitride and etching the dielectric film from all horizontal surfaces by RIE. The spacers 110 are formed around portions of the nanowire 109 that extend from the polysilicon layer 102 and surround portions of the nanowires 109. Depending upon the process used to etch the spacers 110, a residual portion of spacer 110 may remain under the nanowire 109.

The source and drain diffusion regions may include either N type (for NMOS) or P type (for PMOS) doped with, for example, As or P (N type) or B (P type) at a concentration level typically 1e19 atoms/cm$^3$ or greater.

Figure 2:
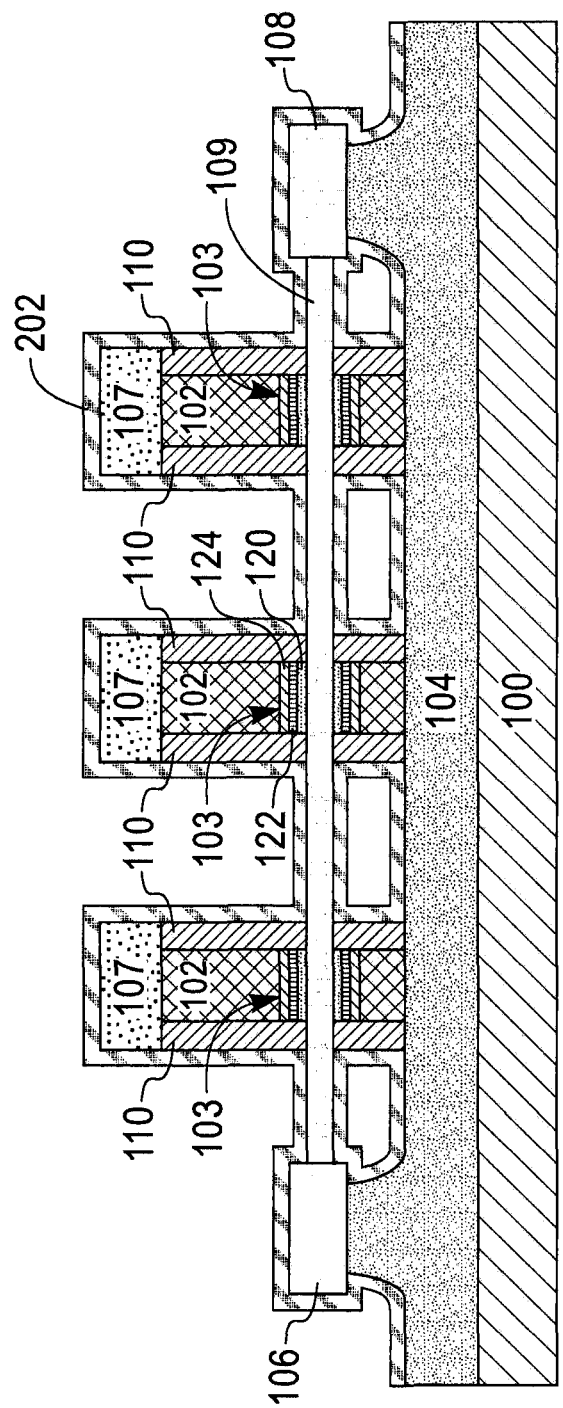

FIG. 2 illustrates a resultant structure following a blanket deposition of a first metallic layer 202. The first metallic layer is, for example, less than 30 nanometers thick, and is deposited over the exposed surfaces of the device. The first metallic layer may include a metallic material such as, for example, tungsten or tantalum. The metal selected for the first metallic layer may be selected based on the properties of the material. Since forming a silicide from the first metallic layer is undesirable, and the fabrication process may expose the device to high temperatures after the formation of the first metallic layer, a metallic material should be selected that has a threshold for forming a silicide that is higher than the temperatures that will be used in subsequent fabrication processes.

Figure 3:
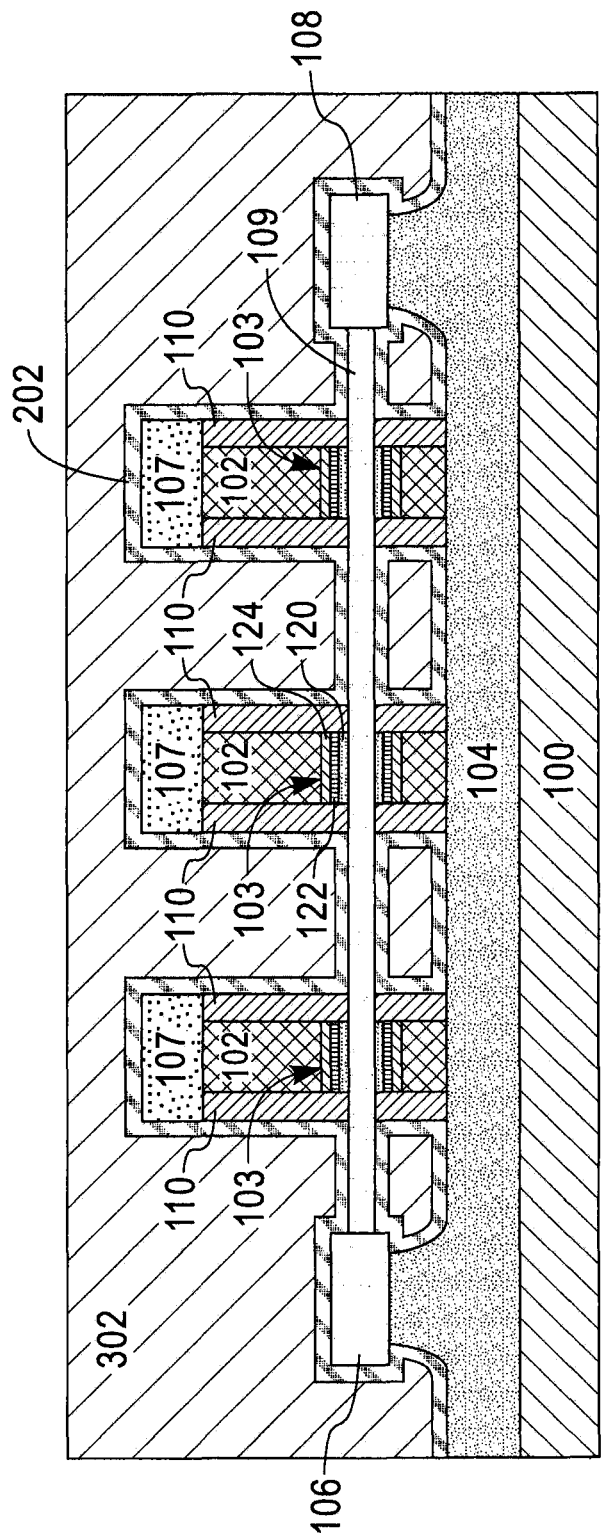

FIG. 3 illustrates an example of the resultant structure following the deposition of contact material 302 such as, for example, W, Cu, Ag, or Al on the first metallic layer 202.

Figure 4:
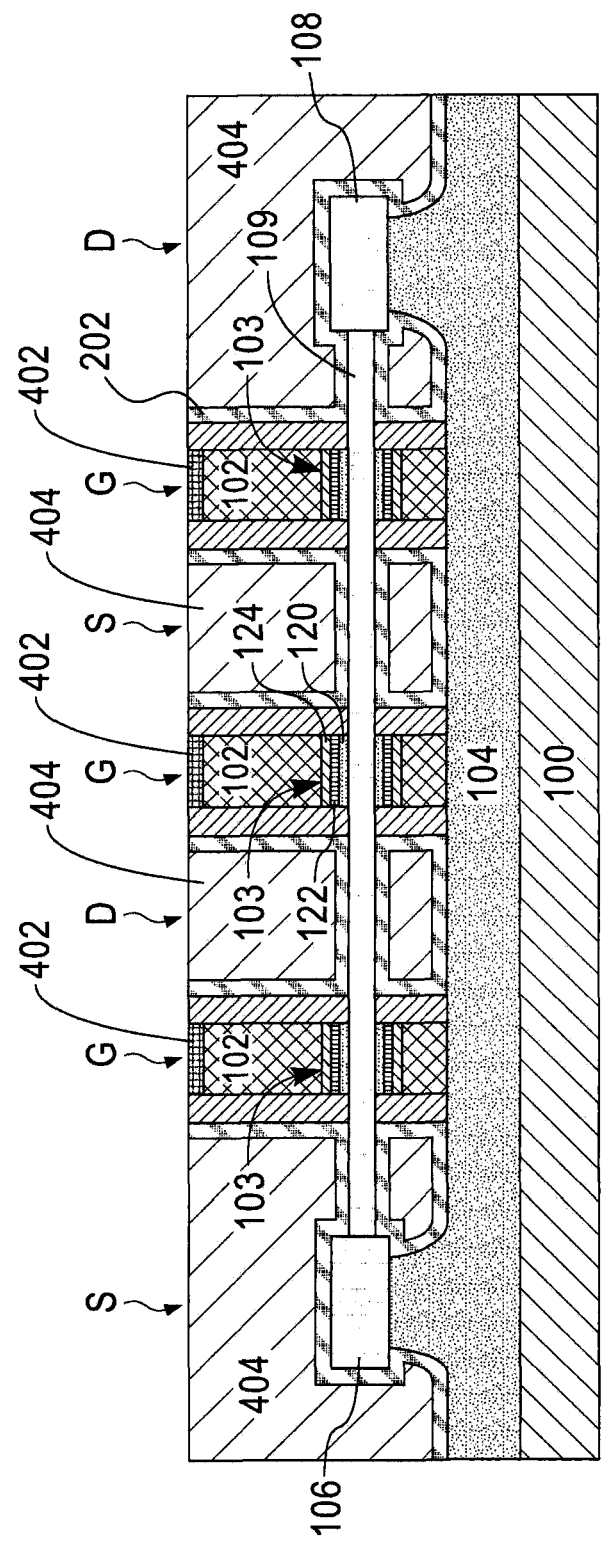

FIG. 4 illustrates an example of the resultant structure where a portion of the contact material 302 (of FIG. 3) and the hardmasks 107 are removed by, for example, a chemical mechanical polishing (CMP) or etching process. Once the polysilicon 102 is exposed by the CMP process, a silicide 402 may be formed on the exposed polysilicon 102 to improve conductivity in the gate region (G). Alternatively, for metallic gates, the CMP process may remove the hardmasks 107 and expose the metallic gate. The resultant contacts 404 define current paths to the source (S) and drain (D) regions of the devices.

Figure 5:
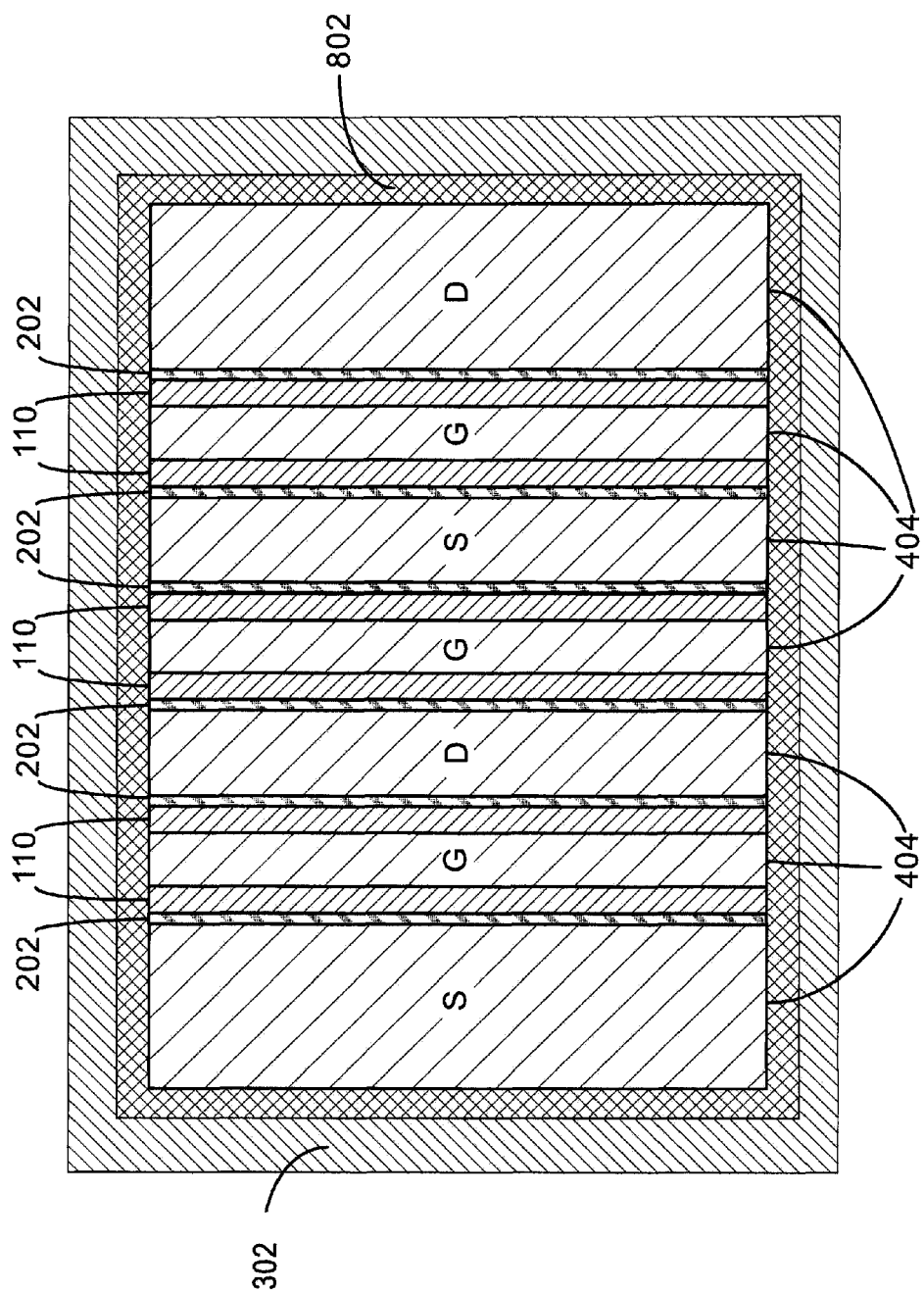
FIG. 5 is a top-down view of the devices of FIG. 4.

FIG. 5 illustrates a top view of the resultant structure of the illustrated embodiment of FIG. 4 following the isolation of the devices with a material 802 such as, for example, an oxide or nitride dielectric material. Following the formation of the contact material 302 and the contacts 404, a mask layer (not shown) is patterned on the devices to define a trench area around the devices. An etching process is used to remove contact 302 material from the trench area. The trench area is filled with the material 802 as illustrated in FIG. 5 to form an isolation region around the device. Alternatively, the isolation region defined by the material 802 may be formed by forming a mask over the devices in the illustrated embodiment. Once the mask is formed, an etching process may be performed to remove metal 302 and 202. The etching defines the length of the contacts 404 and electrically isolates the source and drain regions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming a nanowire field effect transistor (FET) device, the method comprising:
    forming a nanowire over a semiconductor substrate, wherein the nanowire is suspended above the semiconductor substrate;
    forming a gate stack around a portion of the nanowire;
    forming a capping layer on the gate stack;
    forming a spacer adjacent to sidewalls of the gate stack and around portions of nanowire extending from the gate stack, wherein the spacer surrounds portions of nanowire extending from the gate stack;
    forming a hardmask layer on the capping layer and the spacer;
    forming a metallic layer over the exposed portions of the device, wherein the metallic layer is disposed circumferentially around portions of the nanowire not covered by the spacer or the gate stack;
    depositing a conductive material over the metallic layer, wherein the metallic layer and the conductive material are substantially free of silicide;
    removing the hardmask layer from the gate stack; and
    removing portions of the conductive material to define a source region contact and a drain region contact.

2. The method of claim 1, wherein the method further includes forming an isolation region around the device after removing portions of the conductive material to define a source region contact and a drain region contact.

3. The method of claim 1, wherein the method further includes removing a portion of the metallic layer to expose a portion of the capping layer.

4. The method of claim 3, wherein the method further includes forming a silicide material on the exposed capping layer.

5. The method of claim 1, wherein the portions of the conductive material are removed by a chemical mechanical polishing (CMP) process.

6. The method of claim 1, wherein the gate stack includes a silicon oxide layer disposed on the gate portion of the nanowire, a dielectric layer disposed on the silicon oxide layer, and a metal layer disposed on the dielectric layer.

7. The method of claim 1, wherein the gate stack is formed in circumferential layers surrounding the gate portion of the nanowire.

8. The method of claim 1, wherein the spacer includes a nitride material.

9. The method of claim 1, wherein the metallic layer includes tantalum.

10. The method of claim 1, wherein the metallic layer includes tungsten.

11. A method for forming a nanowire field effect transistor (FET) device, the method comprising:
  forming a nanowire over a semiconductor substrate, wherein the nanowire is suspended above the semiconductor substrate;
  forming a gate stack around a portion of the nanowire;
  forming a capping layer on the gate stack;
  forming a spacer adjacent to sidewalls of the gate stack and around portions of nanowire extending from the gate stack, wherein the spacer surrounds portions of nanowire extending from the gate stack;
  forming a hardmask layer on the capping layer and the spacer;
  forming a metallic layer over the exposed portions of the device, wherein the metallic layer is disposed circumferentially around portions of the nanowire not covered by the spacer or the gate stack and wherein the metallic layer includes a metallic material that has a temperature threshold for forming a silicide when the metallic material is exposed to heat that is higher than temperatures used in subsequent fabrication processes used to fabricate the FET device such that the metallic material layer remains substantially free of silicide following the fabrication of the FET device;
  depositing a conductive material over the metallic layer;
  removing the hardmask layer from the gate stack; and
  removing portions of the conductive material to define a source region contact and a drain region contact.

12. The method of claim 11, wherein the method further includes forming an isolation region around the device after removing portions of the conductive material to define a source region contact and a drain region contact.

13. The method of claim 11, wherein the method further includes removing a portion of the metallic layer to expose a portion of the capping layer.

14. The method of claim 13, wherein the method further includes forming a silicide material on the exposed capping layer.

15. The method of claim 11, wherein the portions of the conductive material are removed by a chemical mechanical polishing (CMP) process.

16. The method of claim 11, wherein the gate stack includes a silicon oxide layer disposed on the gate portion of the nanowire, a dielectric layer disposed on the silicon oxide layer, and a metal layer disposed on the dielectric layer.

17. The method of claim 11, wherein the gate stack is formed in circumferential layers surrounding the gate portion of the nanowire.

18. The method of claim 11, wherein the spacer includes a nitride material.

19. The method of claim 11, wherein the metallic layer includes tantalum.

20. The method of claim 11, wherein the metallic layer includes tungsten.

* * * * *